(12) United States Patent
Hu et al.

(10) Patent No.: US 11,335,656 B2
(45) Date of Patent: May 17, 2022

(54) SEMICONDUCTOR DEVICE AND METHOD OF MANUFACTURING

(71) Applicant: Taiwan Semiconductor Manufacturing Co., Ltd., Hsinchu (TW)

(72) Inventors: Chih-Chia Hu, Taipei (TW); Ching-Pin Yuan, Hsinchu (TW); Sung-Feng Yeh, Taipei (TW); Sen-Bor Jan, Tainan (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 59 days.

(21) Appl. No.: 17/027,175

(22) Filed: Sep. 21, 2020

(65) Prior Publication Data

US 2021/0005561 A1    Jan. 7, 2021

Related U.S. Application Data

(62) Division of application No. 16/121,114, filed on Sep. 4, 2018, now Pat. No. 10,784,219.

(60) Provisional application No. 62/592,937, filed on Nov. 30, 2017.

(51) Int. Cl.
*H01L 23/00* (2006.01)
*H01L 23/544* (2006.01)
(Continued)

(52) U.S. Cl.
CPC ............ *H01L 24/06* (2013.01); *H01L 23/522* (2013.01); *H01L 23/544* (2013.01); *H01L 24/05* (2013.01); *H01L 24/08* (2013.01); *H01L 24/09* (2013.01); *H01L 24/80* (2013.01); *H01L 25/0657* (2013.01); *H01L 2223/54426* (2013.01); *H01L 2224/05553* (2013.01); *H01L 2224/05554* (2013.01); *H01L 2224/05555* (2013.01);
(Continued)

(58) Field of Classification Search
None
See application file for complete search history.

(56) References Cited

U.S. PATENT DOCUMENTS 8,012,776 B2 *   9/2011   Derderian ............... H01L 24/73
                                                    438/25
9,922,845 B1 *   3/2018   Shih .................. H01L 23/53252
(Continued)

OTHER PUBLICATIONS

Stoney, G. Gerald., "The Tension of Metallic Films deposited by Electrolysis," Proceedings of the Royal Society of London, Series A: Mathematical, Physical and Engineering Sciences, May 6, 1909, 4 pages.

*Primary Examiner* — Long Pham
(74) *Attorney, Agent, or Firm* — Slater Matsil, LLP

(57) ABSTRACT

A semiconductor device including a first die and a second die bonded to one another. The first die includes a first passivation layer over a substrate, and first bond pads in the first passivation layer. The second die includes a second passivation layer, which may be bonded to the first passivation layer, and second bond pads in the second passivation layer, which may be bonded to the first bond pads. The second bond pads include inner bond pads and outer bond pads. The outer bond pads may have a greater diameter than the inner bond pads as well as the first bond pads.

20 Claims, 15 Drawing Sheets

(51) Int. Cl.
*H01L 25/065* (2006.01)
*H01L 23/522* (2006.01)

(52) U.S. Cl.
CPC ............... *H01L 2224/05569* (2013.01); *H01L 2224/0603* (2013.01); *H01L 2224/0612* (2013.01); *H01L 2224/06051* (2013.01); *H01L 2224/06132* (2013.01); *H01L 2224/08121* (2013.01); *H01L 2224/08145* (2013.01); *H01L 2224/091* (2013.01); *H01L 2224/0913* (2013.01); *H01L 2224/09051* (2013.01); *H01L 2224/8001* (2013.01); *H01L 2224/80011* (2013.01); *H01L 2224/80013* (2013.01); *H01L 2224/8013* (2013.01); *H01L 2224/80132* (2013.01); *H01L 2224/80203* (2013.01); *H01L 2224/80357* (2013.01); *H01L 2224/80815* (2013.01); *H01L 2224/80895* (2013.01); *H01L 2224/80896* (2013.01); *H01L 2224/80905* (2013.01); *H01L 2224/80986* (2013.01); *H01L 2924/3511* (2013.01)

(56) References Cited

U.S. PATENT DOCUMENTS

| | | | |
|---|---|---|---|
| 2010/0237484 A1* | 9/2010 | Han | H01L 24/91 257/686 |
| 2019/0164919 A1* | 5/2019 | Hu | H01L 24/80 |
| 2019/0273022 A1* | 9/2019 | Kim | H01L 21/76856 |

* cited by examiner

US 11,335,656 B2

SEMICONDUCTOR DEVICE AND METHOD OF MANUFACTURING

PRIORITY CLAIM AND CROSS-REFERENCE

This application is a division of U.S. patent application Ser. No. 16/121,114, filed Sep. 4, 2018, which claims the benefits of U.S. Provisional Application Ser. No. 62/592,937, filed on Nov. 30, 2017, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
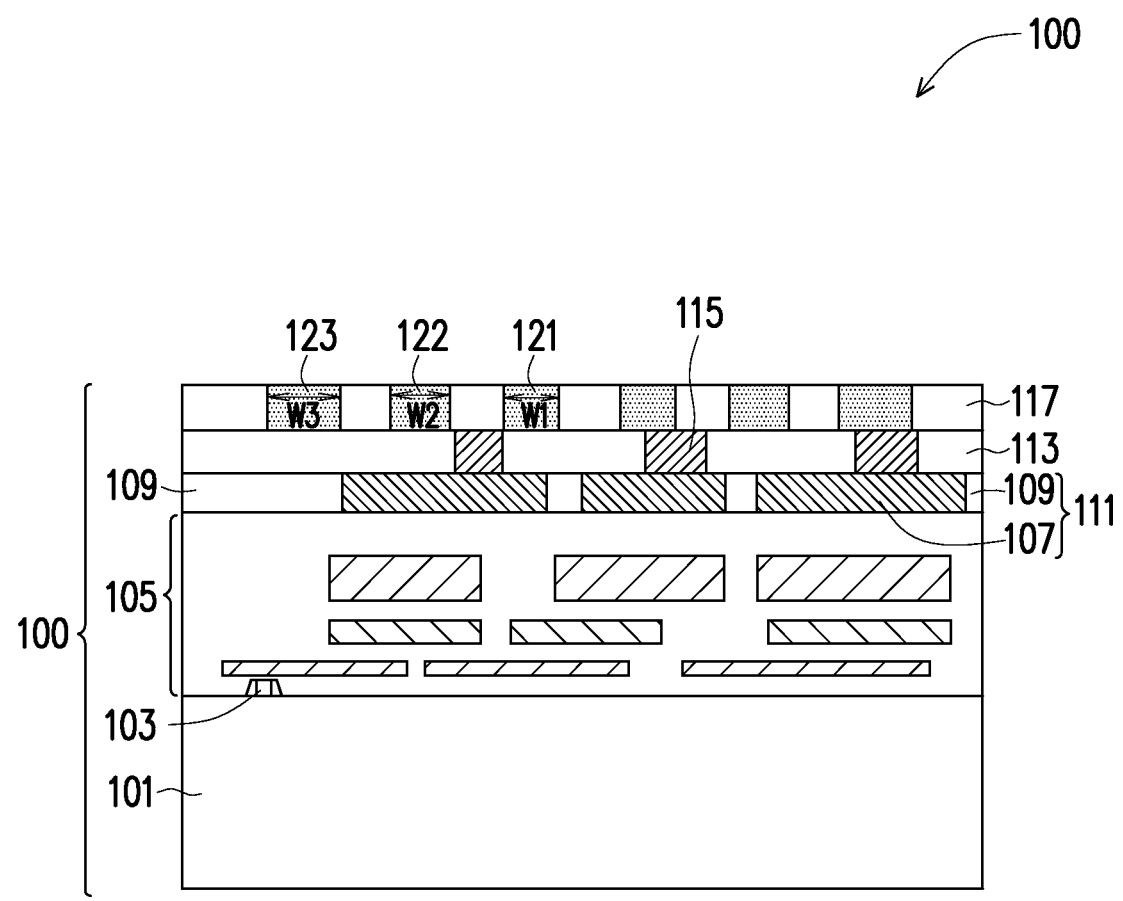
FIG. 1 illustrates a side view of a first semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a side view of a first semiconductor device 100, which includes a substrate 101. The first semiconductor device 100 may be a die or a package component. The substrate 101 may be a bulk silicon substrate although other semiconductor materials including group III, group IV, and group V elements may also be used. Active devices 103, such as transistors, may be formed in and/or on the substrate 101.

An interconnect structure 105 is formed over the substrate 101. In some embodiments, the interconnect structure 105 may include at least one dielectric layer formed of low-k dielectric materials having k values, for example, lower than about 4.0. In some embodiments, the dielectric layers of the interconnect structure 105 may be made of, for example, silicon oxide, SiCOH, and the like. The interconnect structure 105 may further include metal lines and vias (i.e., connections), which are formed in the dielectric layers. For example, the interconnect structure 105 may include a plurality of metal layers that are interconnected through vias. The metal lines and vias may be formed of copper or copper alloys, and they can also be formed of other metals. The metal lines and vias may be formed by etching openings in the dielectric layers, filling the openings with a conductive material, and performing a planarization (such as a chemical mechanical polishing, or CMP) to level top surfaces of the metal lines and vias with top surfaces of the dielectric layers.

A top metal layer 111 is formed over the interconnect structure 105. The top metal layer 111 includes a first dielectric layer 109 and conductive features 107. The top metal layer 111 is formed by depositing the first dielectric layer 109 over the top surface of the interconnect structure 105. The first dielectric layer 109 may be deposited by chemical vapor deposition (CVD), physical vapor deposition (PVD), or the like. The dielectric layer may comprise the same material as the dielectric layers of the interconnect structure 105. For example, in some embodiments, the first dielectric layer 109 may be made of silicon oxide, SiCOH, and the like.

The first dielectric layer 109 may then be etched to form openings exposing the top surface of the interconnect structure 105. The conductive features 107 may be deposited in the openings by, for example, a plating process. The conductive features 107 may then be planarized by a process such as CMP. The conductive features 107 may be made of copper or copper alloy. Other materials, such as aluminum, aluminum alloy, or the like may also be used to form the conductive features 107. As shown in FIG. 1, the conductive features 107 may be discrete features. For example, the conductive features 107 may be separated and electrically isolated from each other by the first dielectric layer 109. According to other embodiments, the conductive features 107 may be portions of a continuous metallic feature.

A passivation layer 113 is formed over the top metal layer 111. In an embodiment, the passivation layer 113 may be polybenzoxazole (PBO), although any suitable material, such as benzocyclobutene (BCB), polyimide, or a polyimide derivative, may alternatively be utilized. The passivation layer 113 may be placed using, e.g., a spin-coating process, although any suitable method may alternatively be used.

A redistribution via 115 may be formed in the passivation layer 113. For example, the passivation layer 113 may be patterned to form an opening through which one of the conductive features 107 is exposed. The patterning of the passivation layer 113 may be performed using photolithography techniques. The redistribution via 115 may then be formed in the opening in the passivation layer 113. The redistribution via 115 may be made of aluminum, aluminum alloy, copper, or copper alloy, although other metallic materials may be used.

A second dielectric layer 117 is formed over the passivation layer 113. In some embodiments, the second dielectric layer 117 may be formed of a low-k dielectric material having a k value, for example, lower than about 4.0. The second dielectric layer 117 may be deposited by CVD, PVD, or the like. The dielectric may comprise the same material as the dielectric layers of the interconnect structure 105 or the first dielectric layer 109. For example, in some embodiments, the second dielectric layer 117 may be made of silicon oxide, SiCOH, and the like.

A first metal pad 121 is formed in the second dielectric layer 117. In an embodiment, the first metal pad 121 may comprise a set of more than one metal pad, wherein each metal pad has the same or varying sizes and shapes. For example, the second dielectric layer 117 may be patterned to form a trench partially through the second dielectric layer 117 or an opening fully through the first dielectric layer exposing a portion of the passivation layer 113 and/or the redistribution via 115. The patterning of the second dielectric layer 117 may be performed using photolithography techniques. The first metal pad 121 may then be formed in an opening in the second dielectric layer 117. The first metal pad 121 may be made of aluminum, copper, nickel, tungsten, and the like, or alloys thereof, or other suitable materials. The first metal pad 121 and the second dielectric layer 117 may then be planarized (such as a CMP) to level top surfaces of the first metal pad 121 and the second dielectric layer 117. The top surfaces of the first metal pad 121 and the second dielectric layer 117 may be substantially level with respect to one another, and/or within the same plane.

A second metal pad 122 is also formed in the second dielectric layer 117. In an embodiment, the second metal pad 122 may comprise a set of more than one metal pad, wherein each metal pad has the same or varying sizes and shapes. For example, the second dielectric layer 117 may be patterned to form a trench partially through the second dielectric layer 117 or an opening fully through the first dielectric layer exposing a portion of the passivation layer 113 and/or the redistribution via 115. The second metal pad 122 may be formed simultaneously with the first metal pad 121. The second metal pad 122 may be formed of the same or a different material than the first metal pad 121, including any of the materials listed above for the first metal pad 121.

In an embodiment, a third metal pad 123 may also be formed in the second dielectric layer 117. In an embodiment, the third metal pad 123 may comprise a set of more than one metal pad, wherein each metal pad has the same or varying sizes and shapes. For example, the second dielectric layer 117 may be patterned to form a trench partially through the second dielectric layer 117 or an opening fully through the first dielectric layer exposing a portion of the passivation layer 113 and/or the redistribution via 115. The third metal pad 123 may be formed simultaneously with the first metal pad 121 and/or the second metal pad 122. The third metal pad may be formed of the same or a different material than the first metal pad 121 and/or the second metal pad 122, including any of the materials listed above for the first metal pad 121.

In a further embodiment, any number of additional metal pads or sets of metal pads may be formed at even greater distances from the innermost region of the second dielectric layer 117. In such an embodiment, the additional metal pads may form concentric rings around any of the other metal pads, may be formed of the same or different material as any of the other metal pads, and may be formed simultaneously with any of the other metal pads, including any of the materials listed above for the first metal pad 121.

After formation of each of the first metal pad 121, the second metal pad 122, the third metal pad 123, or all of the metal pads, the metal pads may be planarized (such as a CMP) with the second dielectric layer 117. The resulting thickness of the metal pads and/or the second dielectric layer 117 may be between about 0.15 µm and 3.4 µm.

Figure 2:
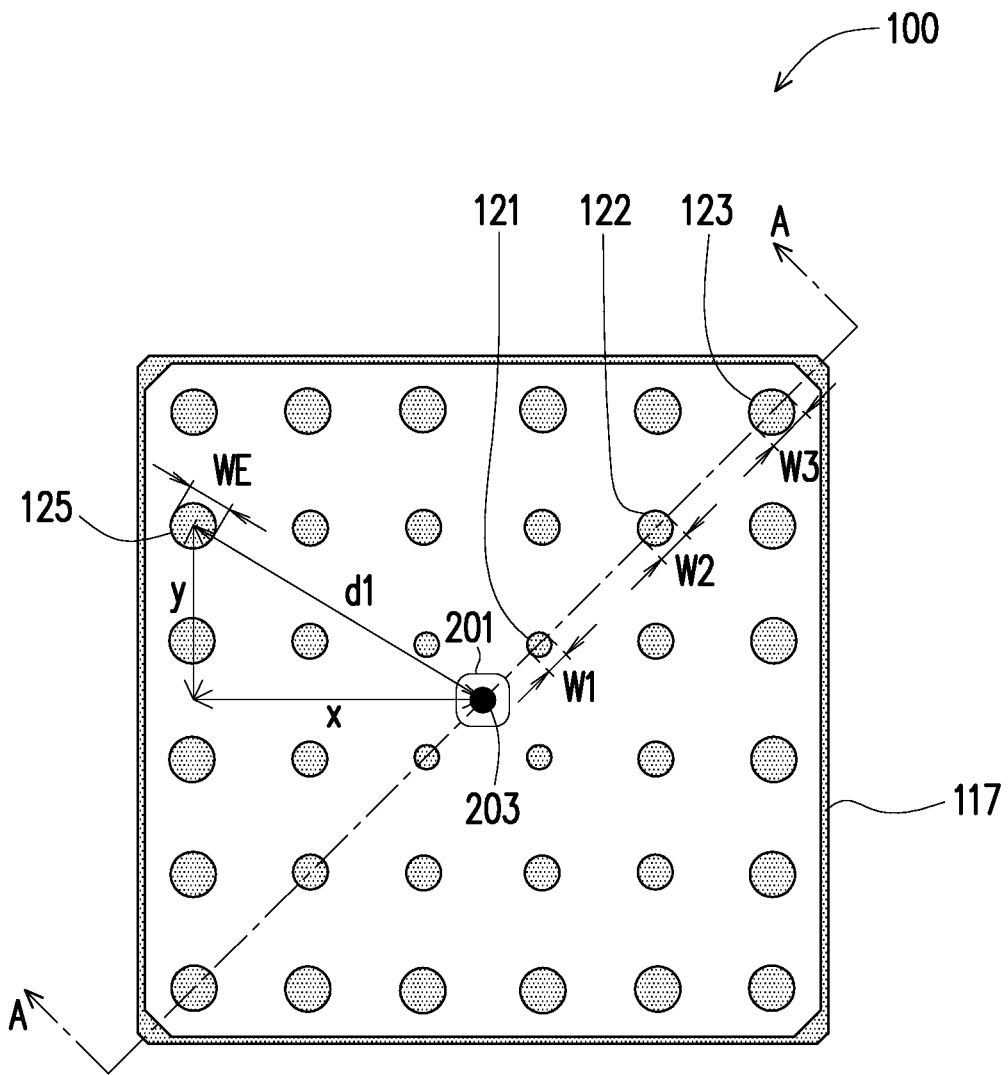
FIG. 2 illustrates a top down view of the first semiconductor device, in accordance with some embodiments.

FIG. 2 illustrates a top down view of first semiconductor device 100. As shown in FIG. 2, FIG. 1 illustrates a cross-section view at the A-A line. The second dielectric layer 117 may comprise an innermost region 201. The innermost region 201 may comprise a centermost point 203 in the second dielectric layer 117.

The first metal pad 121 is located in or proximal to the innermost region 201 of second dielectric layer 117. In another embodiment, the first metal pad 121 may form the centermost point 203. In an embodiment in which the first metal pad 121 is a set of metal pads, the first metal pad 121 may form a ring around the innermost region and the centermost point 203. As such, the first metal pad 121 may be between about 0 µm and 7 µm from the centermost point 203. The second metal pad 122 may form a concentric ring around the first metal pad 121, the innermost region 201, and the centermost point 203. The third metal pad 123 and any other sets of metal pads may also form concentric rings around the first metal pad 121, the second metal pad 122, the innermost region 201, and the centermost point 203.

The first metal pad 121 (or each first metal pad 121 in the set) may have a circular shape, an oval-like shape, an elliptical shape, a rectangular shape, or the like. The first metal pad 121 has a width W1. The width W1 may be between about 0.5 µm and 4.5 µm.

The second metal pad 122 is a greater distance from the innermost region 201 of the second dielectric layer 117 than the first metal pad 121. As alluded to above, when the second metal pad 122 comprises a set of more than one metal pad, the second metal pad 122 may comprise a set of metal pads forming a concentric ring around the first metal pad 121, the second metal pad 122 being a greater distance than the first metal pad 121 from the innermost region 201 and the centermost point 203 of the second dielectric layer 117. As such, the second metal pad 122 may be between about 1 µm and 14 µm from the centermost point 203.

The second metal pad 122 (or each second metal pad 122 in the set) may have a circular shape, an oval-like shape, an elliptical shape, a rectangular shape, or the like. The shape of the second metal pad 122 may be the same general type of shape as the first metal pad 121 or may be different. The second metal pad 122 has a width W2. The width W2 may be greater than or equal to the width W1. The width W2 may be between about 0.7 µm and 4.0 µm.

The third metal pad 123 is a greater distance from the innermost region 201 of the second dielectric layer 117 than the first metal pad 121 and the second metal pad 122. As alluded to above, when the third metal pad 123 comprises a set of more than one metal pad, the third metal pad 123 may comprise a set of metal pads forming a concentric ring around the second metal pad 122 and/or the third metal pad 123, the third metal pad 123 being a greater distance than the second metal pad 122 from the innermost region 201 and the centermost point 203 of the second dielectric layer 117. As such, the third metal pad 123 may be between about 2 µm and 21 µm from the centermost point 203.

The third metal pad 123 (or each third metal pad 123 in the set) may have a circular shape, an oval-like shape, an elliptical shape, a rectangular shape, or the like. The shape of the third metal pad 123 may be the same general type of shape as the first metal pad 121 and/or the second metal pad 122 or may be different. The third metal pad 123 has a width W3. The width W3 may be between about 1.0 µm and 4.5 µm. The width W3 may be greater than or equal to width W2 and/or greater than or equal to the width W1.

After forming the metal pads of the first semiconductor device 100 (e.g., first metal pad 121, second metal pad 122, third metal pad 123, etc.), a back side planarization process may be performed to remove some substrate 101 material from first semiconductor device 100 to produce thinned substrate 101 (not shown in the figures). The back side planarization process may comprise, e.g., a chemical mechanical polish (CMP). The CMP process may utilize etchants and abrasive, which may be applied to a back side surface of substrate 101. Material of the back side surface of substrate 101 is ground with a platen to planarize and remove back side material of substrate 101. It will be appreciated by persons skilled in the art that the CMP process described herein is intended to be illustrative, and is not intended to limit the embodiments. Rather, any suitable planarization process, such as a physical grinding process or a series of one or more etches, may be alternatively or conjunctively utilized.

In a representative embodiment, substrate 101 may have a thickness of between about 500 µm and 1000 µm, or about 750 µm prior to the planarized removal of material, and the thinned substrate 101 may have a thickness of between about 50 µm and 300 µm, or about 100 µm after the planarized removal of material. Thereafter, the first semiconductor device 100 may be singulated from the wafer along a scribe line. Persons skilled in the art will appreciate that utilizing a saw blade to singulate the wafer is merely one illustrative embodiment, and is not intended to be limiting. Alternative methods for singulating the wafer, such as one or more etches, laser cutting, or the like may be alternatively or conjunctively utilized.

As shown in FIG. 2, a first exemplary metal pad 125 on first semiconductor device 100 may be any of the first metal pad 121, the second metal pad 122, the third metal pad 123, or otherwise. After singulation and die thinning and before bonding the first semiconductor device 100, the first exemplary metal pad 125 is located a distance d1 from the centermost point 203. The distance d1 is measured from the center of the first exemplary metal pad 125. The distance d1 may be greater than the distance from the centermost point 203 at formation of the first exemplary metal pad 125 due to the first semiconductor device 100 undergoing an expansion, which will be discussed in detail later.

Figure 3:
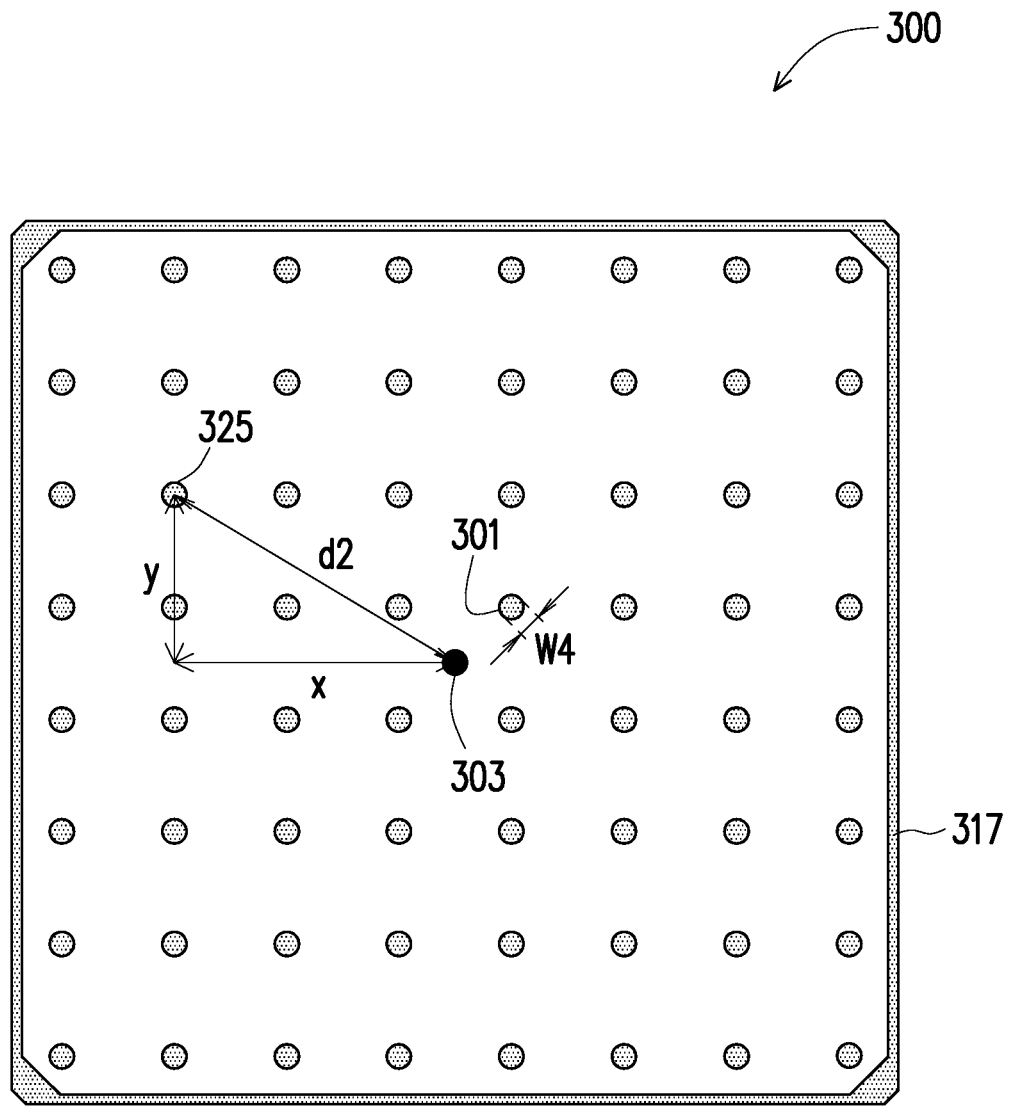
FIG. 3 illustrates a top down view of a second semiconductor device, in accordance with some embodiments.

FIG. 3 illustrates a top down view of a second semiconductor device 300. The second semiconductor device 300 may be a die or a package component, which as discussed later in detail, the first semiconductor device 100 will be bonded to the second semiconductor device 300. The second semiconductor device 300 may be similar to the first semiconductor device 100, such as by having a substrate 319 (not illustrated in FIG. 3, but illustrated in FIG. 4). As shown in FIG. 3, the second semiconductor device 300 comprises fourth metal pads 301 formed in a third dielectric layer 317. Each fourth metal pad 301 may have a circular shape, an oval-like shape, an elliptical shape, a rectangular shape, or the like. The each fourth metal pad 301 may be the same shape as the first metal pad 121, the second metal pad 122, and/or the third metal pad 123, or it may be different. One or more of the fourth metal pads 301 corresponds to metal pads of first semiconductor device 100—whether the first metal pad 121, the second metal pad 122, the third metal pad 123, or otherwise. Each fourth metal pad 301 may have a width W4. The width W4 may be between about 0.5 µm and 4.5 µm. The width W4 may be the same as or less than the width W1.

As shown in FIG. 3, a second exemplary metal pad 325 on second semiconductor device 300 is located a distance d2 from a central point 303. The central point 303 corresponds to the centermost point 203 on the first semiconductor device 100. As such, the central point 303 may or may not be the centermost point on the third dielectric layer 317. The distance d2 is measured from the center of the second exemplary metal pad 325. For example, the distance d2 may be calculated based on the "x" and "y" distances from the central point 303 using the following equation:

$$d2=\sqrt{x^2+y^2}$$

The second exemplary metal pad 325 may have the same width as any of the fourth metal pads 301. As such, the second exemplary metal pad 325 may have width W4 as well.

The first exemplary metal pad 125 on the first semiconductor device 100 corresponds to the second exemplary metal pad 325 on the second semiconductor device 300. As discussed above, the first exemplary metal pad 125 is located the distance d1 from the centermost point 203, while the second exemplary metal pad 325 is located the distance d2 from the central point 303. The distance d1 may be the same as or different than distance d2. For example, the distance d1 may be calculated based on the "x" and "y" distances from the centermost point 203 using the following equation:

$$d1=\sqrt{x^2+y^2}$$

After forming the first metal pads 121, the second metal pads 122, etc. in the second dielectric layer 117 of first semiconductor device 100, the first semiconductor device 100 may undergo additional process steps, as discussed above, before being bonded to the second semiconductor device 300. Those process steps may result in a warping of the first semiconductor device 100 causing an expansion along the plane illustrated by FIG. 2. In particular, the dielectric portions of the first semiconductor device 100 may expand, including the second dielectric layer 117. The expansion may occur outwardly from the centermost point 203. Accordingly, the metal pads (e.g., the first metal pad 121, the second metal pad 122, the third metal pad 123, etc.) of the first semiconductor device 100 may move outward from the centermost point 203, the metal pads closest to the centermost point 203 being least affected and the metal pads farthest from the centermost point 203 being most affected.

Due to the expansion, the first exemplary metal pad 125 may have distance d1 from the centermost point 203, which may be greater than distance d2. The metal pads of the first semiconductor device 100 may be formed with widths selected to account for an increased expansion at an increased distance from the centermost point 203. Accordingly, the first exemplary metal pad 125 may be formed with a width WE that is greater than the width W4. That is, the distance d1 may be greater than the distance d2, the width WE may be greater than the width W4, or both. It is also possible for the distance d1 to be less than the distance d2 while the width WE is greater than the width W4, or vice versa. For example, the width WE may be proportionate to the distance d1 by an expansion coefficient EC. The expansion coefficient EC is an estimated degree of expansion based on several parameters, including: the size and shape of the wafer, the thickness of the wafer, the size and shape of the first semiconductor device 100, the material composition of the wafer and layers that compose the wafer, the thickness of the first semiconductor device 100, the number and thicknesses of dielectric layers in the first semiconductor device 100, and the additional process steps administered to the first semiconductor device 100 after forming the metal pads and before bonding with the second semiconductor device 300. Further, the expansion coefficient EC may be derived from the Young's modulus E of a film. Young's modulus E can be calculated by dividing the tensile stress $\sigma(\varepsilon)$ by the engineering extensional strain $\varepsilon$ in the elastic portion of the physical stress-strain curve, by the equation as follows:

$$E = \frac{F/A}{\Delta L/L_0} = \frac{FL_0}{A\Delta L}$$

where E is the Young's modulus (modulus of elasticity), F is the force exerted on an object under tension, A is the actual cross-sectional area (which equals the area of the cross-section perpendicular to the applied force), $\Delta L$ is the amount by which the length of the object changes ($\Delta L$ being positive if the material is stretched and negative if the material is compressed), and $L_0$ is the original length of the object. Accordingly, the expansion coefficient EC may be interpreted as $\Delta L/L_0$.

For example, the expansion coefficient EC may be proportionate to a degree of warpage of the wafer before singulating the first semiconductor device 100. In an embodiment, the expansion coefficient EC represents a number of units of expansion in a linear direction. Due to the small scales and the small expected levels of expansion, the expansion coefficient EC may be represented in units of "parts per million" and be between about 15 ppm and 100 ppm, or between about 5 ppm and 300 ppm. In some cases, the expansion coefficient EC may be 0 ppm, or about 0 ppm.

The width WE of the first exemplary metal pad 125 may be selected to account for the expansion of the first semiconductor device 100 at about the location of the first exemplary metal pad 125. In particular, a point on the first semiconductor device 100 that corresponds to a center of the second exemplary metal pad 325, before expansion of the first semiconductor device 100, will move away from the centermost point 203 by about the product of the expansion coefficient EC and the distance d2 of the second exemplary metal pad 325, after expansion of the first semiconductor device 100. As such, the width WE of the first exemplary metal pad 125 may be increased by that expansion and, accordingly, calculated by the following equation:

$$WE = W4 + (EC*d2)$$

The calculated width WE of the first exemplary metal pad 125 will, therefore, include that movement caused by the expansion. That is, the width WE of the first exemplary metal pad 125 may be calculated as greater than the width W4 of the second exemplary metal pad 325 by the amount of expected expansion around the location of the first exemplary metal pad 125. This equation may be applied to each metal pad, individually, on the first semiconductor device 100. In another embodiment, the equation may be applied to one representative metal pad in the set of the first metal pad 121, to one representative metal pad in the set of the second metal pad 122, and/or one representative metal pad in the set of the third metal pad 123. For any given set, the representative metal pad may be the closest metal pad in that set to the centermost point 203, the farthest metal pad in that set from the centermost point 203, or otherwise. In another embodiment, the equation may be applied to one representative metal pad in multiple sets of metal pads. Any combination of the variations of applying the equation to individual metal pads and representative metal pads may be used to choose the widths of the metal pads in the first semiconductor device 100.

The location of the first exemplary metal pad 125 may also be calculated. The location of the first exemplary metal pad 125 may be chosen so that its point that is closest to the innermost region 201 on the first semiconductor device 100 and/or centermost point 203 will align with a point on the corresponding second exemplary metal pad 325 that is closest to the central point 303 on the second semiconductor device 300. As such, the location of the center of first exemplary metal pad 125 at a distance d1 from the centermost point 203 may be calculated by the following equation:

$$d1 = d2 + \left(\frac{EC*d2}{2}\right)$$

Alternatively, the distance d1 may be calculated based on the width WE of the first exemplary metal pad 125 and the width W4 of the corresponding second exemplary metal pad 325 by the following equation:

$$d1 = d2 + \frac{WE - W4}{2}$$

Note that this process may be repeated for some or all of each metal pad (e.g., the first metal pad 121, the second metal pad 122, the third metal pad 123, etc.) on the first semiconductor device 100.

Figure 4:
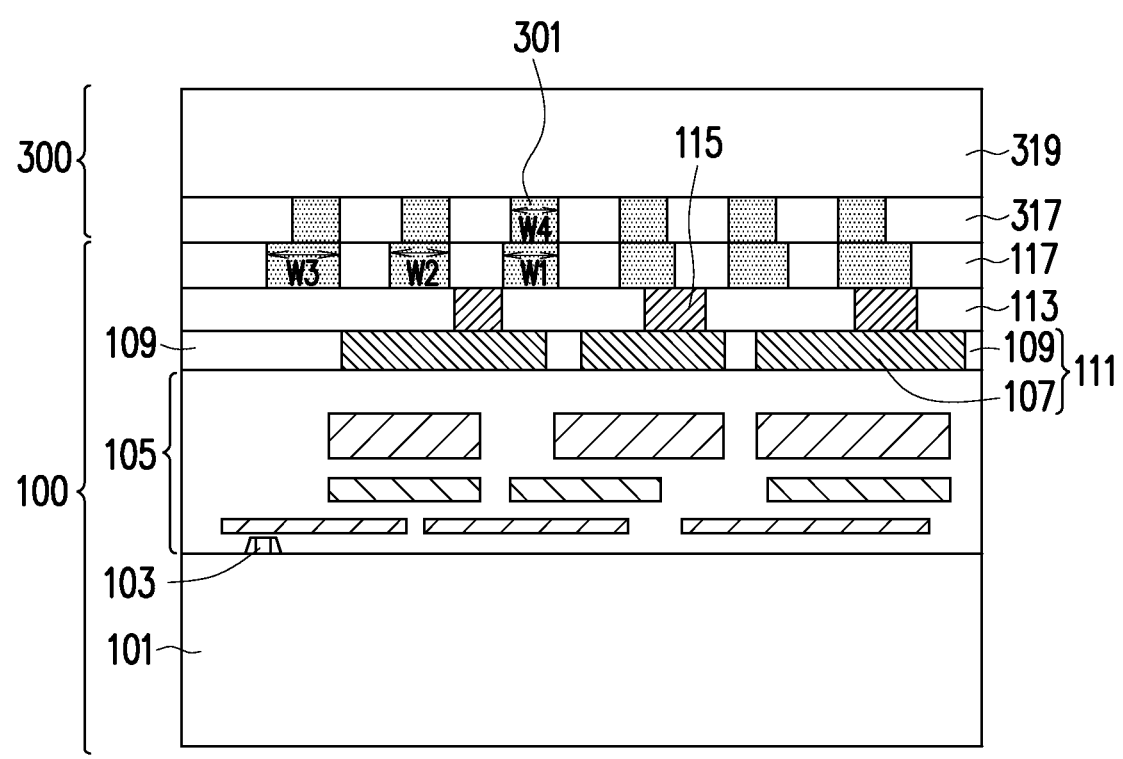
FIG. 4 illustrates a side view of the first semiconductor device bonded to the second semiconductor device, in accordance with some embodiments.

As illustrated in FIG. 4, in some embodiments, the first semiconductor device 100 is bonded to the second semiconductor device 300 by, for example, hybrid bonding. After the top surfaces of the first semiconductor device 100 and the second semiconductor device 300 are planarized, the top surfaces of the first semiconductor device 100 and the second semiconductor device 300 may be activated. Activating the top surfaces of first semiconductor device 100 and the second semiconductor device 300 may comprise a dry treatment, a wet treatment, a plasma treatment, exposure to $H_2$, exposure to $N_2$, exposure to $O_2$, or combinations thereof, as examples. In embodiments where a wet treatment is used, an RCA cleaning may be used, for example. In another embodiment, the activation process may comprise other types of treatments. The activation process assists in the hybrid bonding of the first semiconductor device 100 and the second semiconductor device 300; advantageously allowing the use of lower pressures and temperatures in subsequent hybrid bonding processes.

After the activation process, the first semiconductor device 100 and the second semiconductor device 300 may be cleaned using a chemical rinse. The wafer assembly is then subjected to thermal treatment and contact pressure to hybrid bond the first semiconductor device 100 to the second semiconductor device 300. The first semiconductor device 100 and the second semiconductor device 300 may be subjected to a pressure of about 200 kPa or less, and a temperature between about 200° C. and about 400° C. to fuse the second dielectric layer 117 and the third dielectric layer 317. The first semiconductor device 100 and the second semiconductor device 300 may then be subjected to a temperature at or above the eutectic point for material of the first metal pad 121, the second metal pad 122, and the third metal pad 123 of the first semiconductor device 100 and the fourth metal pads 301 of the second semiconductor device 300, e.g., between about 150° C. and about 650° C., to fuse the metal bond pads. In this manner, fusion of the first semiconductor device 100 and the second semiconductor device 300 forms a hybrid bonded device. In some embodiments, the bonded dies are baked, annealed, pressed, or otherwise treated to strengthen or finalize the bond.

In other embodiments, the first semiconductor device 100 may be bonded to the second semiconductor device 300 by direct surface bonding, metal-to-metal bonding, or another bonding process. A direct surface bonding process creates an oxide-to-oxide bond or substrate-to-substrate bond through a cleaning and/or surface activation process followed by applying pressure, heat, and/or other bonding process steps to the joined surfaces. In some embodiments, the first semiconductor device 100 and the second semiconductor device 300 are bonded by metal-to-metal bonding that is achieved by fusing conductive elements. For example, the metal pads of the first semiconductor device 100 are bonded to the corresponding metal pads of the second semiconductor device 300 through metal-to-metal bonding.

Figure 5:
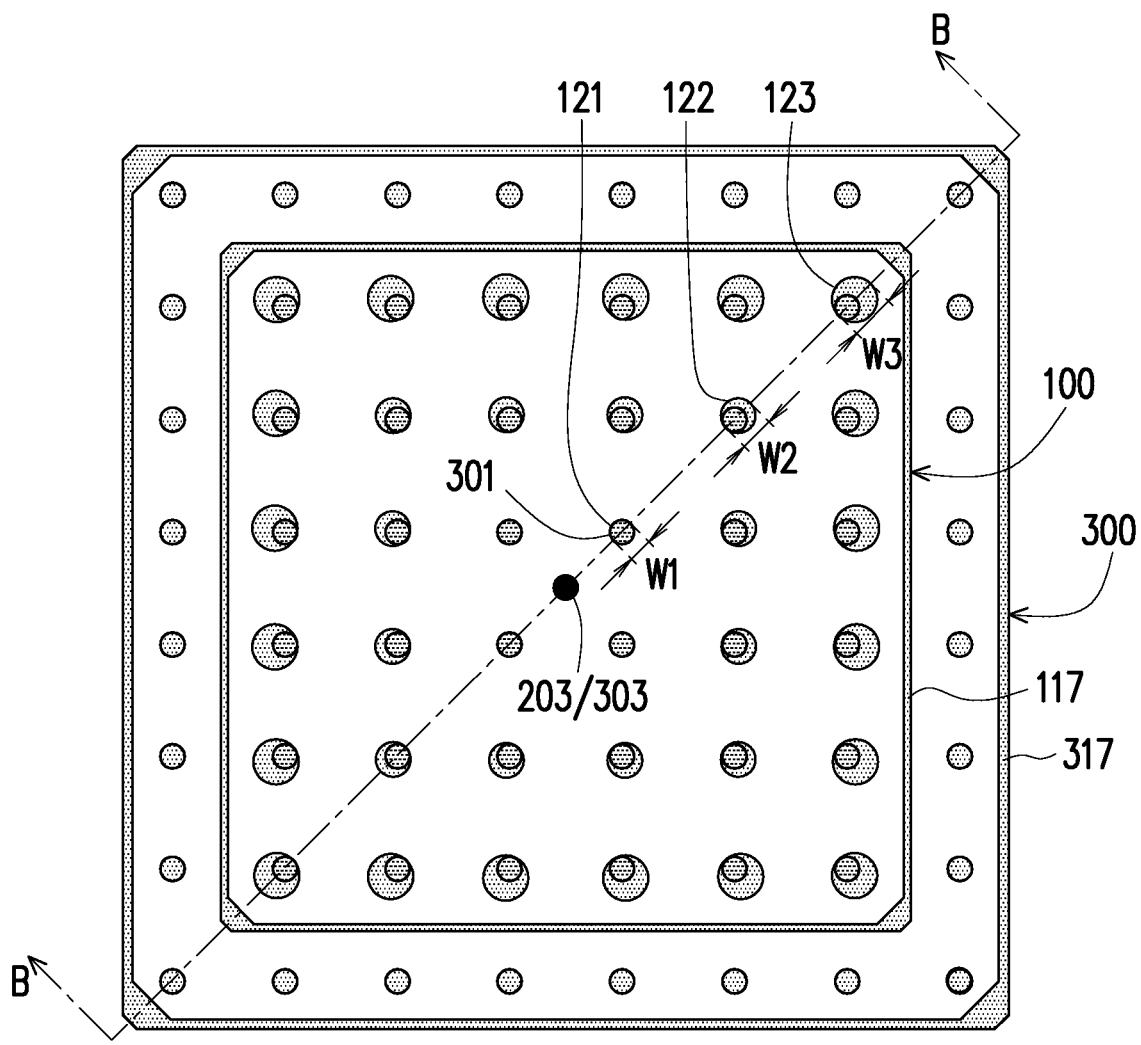
FIG. 5 illustrates a top down views of the first semiconductor device bonded to the second semiconductor device, in accordance with some embodiments.

FIG. 5 illustrates a top down view of first semiconductor device 100 and second semiconductor device 300 at the interface of the bond. As shown in FIG. 5, FIG. 4 illustrates a cross-section view at the B-B line. The first semiconductor device 100 may have a smaller surface area than the second semiconductor device 300. As such, some of the metal pads of the second semiconductor device 300 may not have a corresponding metal pad of the first semiconductor device 100. In addition, some or all of the metal pads of the first semiconductor device 100 (e.g., the first metal pad 121, the second metal pad 122, the third metal pad 123, etc.) have a width, and therefore an area, that is greater than or equal to the width, and therefore the area, of the corresponding metal pads of the second semiconductor device 300 (e.g., the fourth metal pad 301). In an embodiment, the entirety of the surface of each bonded metal pad of the second semiconductor device 300 makes contact with a portion of the corresponding metal pad of the first semiconductor device 100. In some cases, only a partial surface of some or all of the bonded metal pads of the second semiconductor device 300 make contact with a portion of the corresponding metal pads of the first semiconductor device 100. As such, only a partial surface of the metal pads of the first semiconductor device 100 make contact with the corresponding metal pads of the second semiconductor device 300. Further, the centers of the metal pads of the first semiconductor device 100 may not align with the centers of the corresponding metal pads of the second semiconductor device 300. Indeed, the centers of the metal pads of the first semiconductor device 100 may be a greater distance from the centermost point 203 or the central point 303 than the corresponding metal pads of the second semiconductor device 300 from the centermost point 203 or the central point 303. In an embodiment, the centers of the metal pads of the first semiconductor device 100 align with the centers of the corresponding metal pads of the second semiconductor device 300.

As alluded to above, increasing the widths, and therefore areas, of the metal pads on the first semiconductor device 100 with respect to the widths, and therefore areas, of the corresponding metal pads on the second semiconductor device 300 improves the contact area between the corresponding metal pads. The reason is that the increased widths account and compensate for the expansion of the first semiconductor device 100 during the die thinning and other process steps that occur after formation of the metal pads (e.g., the first metal pad 121, the second metal pad 122, the third metal pad 123, etc.) on the first semiconductor device 100 and before bonding to the second semiconductor device 300. The selected greater widths and/or particular locations of the metal pads on the first semiconductor device 100 ensures that an entirety (or close to an entirety) of the exposed surfaces of the corresponding metal pads on the second semiconductor device 300 make contact with the metal pads on the first semiconductor device 100 as opposed to the second dielectric layer 117. As such, the embodiments improve the performance of the electronic device by maximizing the surface area for the bonding (e.g., hybrid bonding) and the surface area for electrical coupling of the metal pads on the first semiconductor device 100 with the corresponding metal pads on the second semiconductor device 300.

Figure 6A:
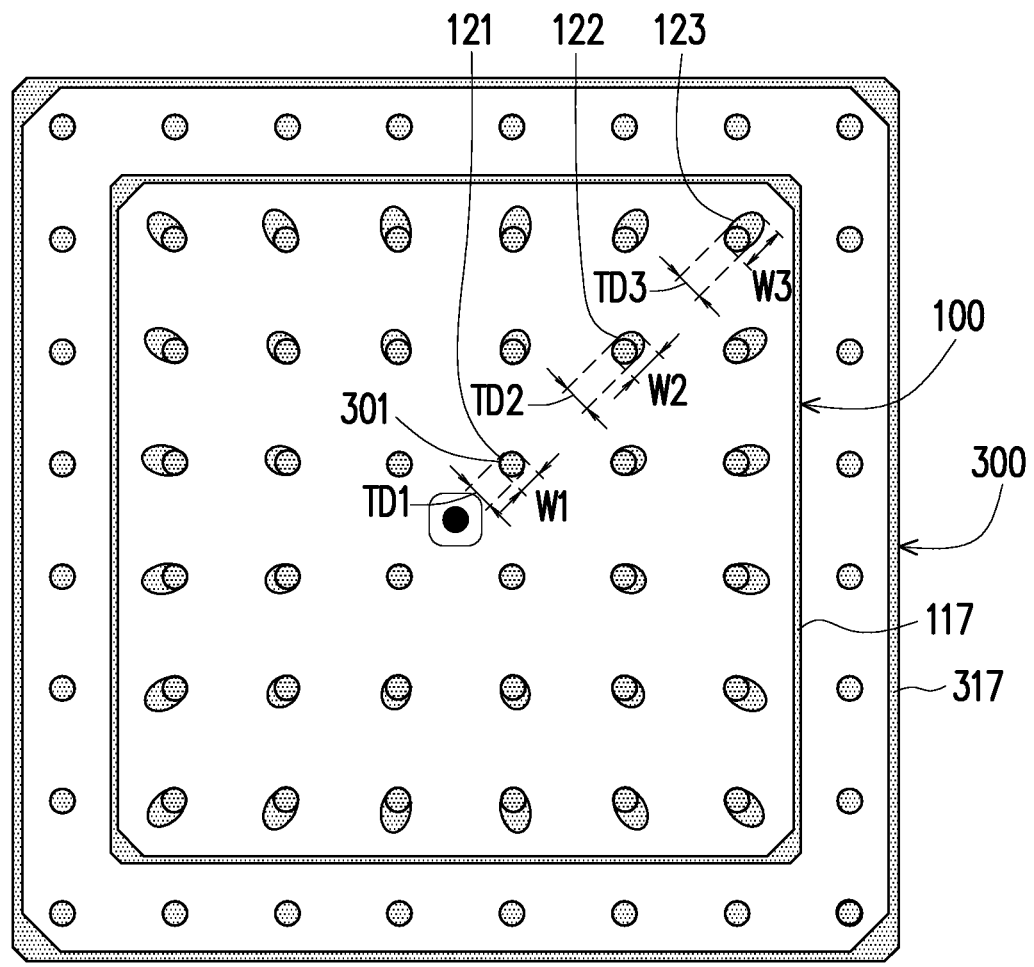
FIG. 6A illustrates a top down view of the first semiconductor device bonded to the second semiconductor device, in accordance with some embodiments.
Figure 6B:
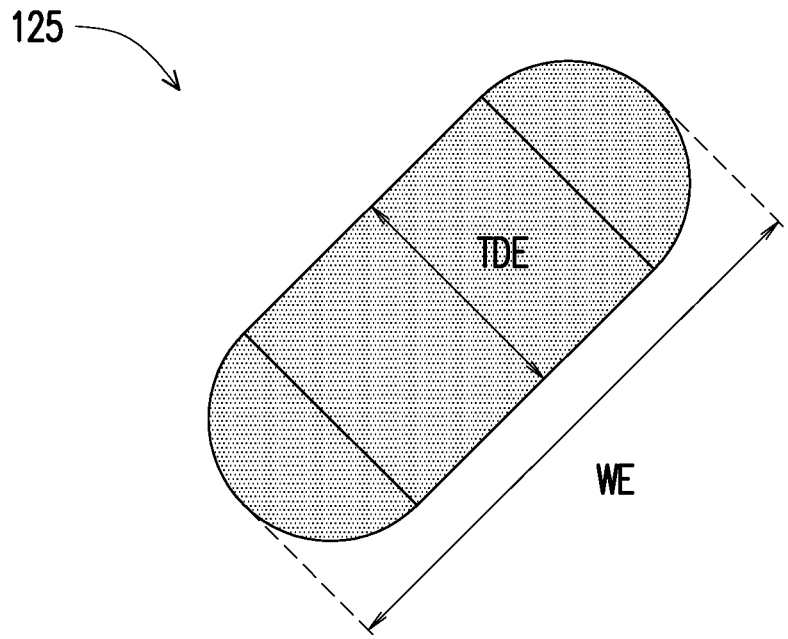
FIGS. 6B-6E illustrate top down views of a metal pad on the first semiconductor device, in accordance with some embodiments.

As illustrated in FIG. 6A, some or all of the first metal pad 121, the second metal pad 122, the third metal pad 123, or the fourth metal pad 301 may have an oval or oval-like shape. As illustrated in FIG. 6B, the oval or oval-like shape may consist of two semicircles and a rectangle. Some or all of those oval or oval-like shaped metal pads may be oriented such that the longest diameter points toward the innermost region 201 and/or the centermost point 203. In this embodiment, the width WE of the first exemplary metal pad 125 may be selected to account for the expected expansion of the first semiconductor device 100 at about the location of the first exemplary metal pad 125. In particular, a point on the first semiconductor device 100 that corresponds to a center of the second exemplary metal pad 325, before expansion of the first semiconductor device 100, will move away from the centermost point 203 by about the product of the expansion coefficient EC and the distance d2 of the second exemplary metal pad 325, after expansion of the first semiconductor device 100. As such, the width WE of the first exemplary metal pad 125 may be chosen to account for that expansion and, accordingly, be calculated by the following equation:

$$WE = W4 + (EC*d2)$$

The calculated width WE of the first exemplary metal pad 125 will, therefore, include that movement caused by the expansion. The rectangular portion of the first exemplary metal pad 125 accounts for the expected expansion through the expansion coefficient EC. That is, the width WE of the first exemplary metal pad 125 may be calculated as greater than the width W4 of the second exemplary metal pad 325 by the amount of expected expansion around the location of the first exemplary metal pad 125. This equation may be applied to each metal pad, individually, on the first semiconductor device 100. In another embodiment, the equation may be applied to one representative metal pad in the set of the first metal pad 121, to one representative metal pad in the set of the second metal pad 122, and/or one representative metal pad in the set of the third metal pad 123. For any given set, the representative metal pad may be the closest metal pad in that set to the centermost point 203, the farthest metal pad in that set from the centermost point 203, or otherwise. In another embodiment, the equation may be applied to one representative metal pad in multiple sets of metal pads. Any combination of the variations of applying the equation to individual metal pads and representative metal pads may be used to choose the widths of the metal pads in the first semiconductor device 100.

The location of the first exemplary metal pad 125 may be calculated. The location of the first exemplary metal pad 125 may be chosen so that its point that is closest to the innermost region 201 on the first semiconductor device 100 and/or centermost point 203 will align with the point on the corresponding second exemplary metal pad 325 that is closest to the central point 303 on the second semiconductor device 300. As such, the location of the center of first exemplary metal pad 125 at a distance d1 from the centermost point 203 may be calculated by the following equation:

$$d1 = d2 + \left(\frac{EC*d2}{2}\right)$$

Alternatively, the distance d1 may be calculated based on the width WE of the first exemplary metal pad 125 and the width W4 of the corresponding second exemplary metal pad 325 by the following equation:

$$d1 = d2 + \frac{WE - W4}{2}$$

Figure 6C:
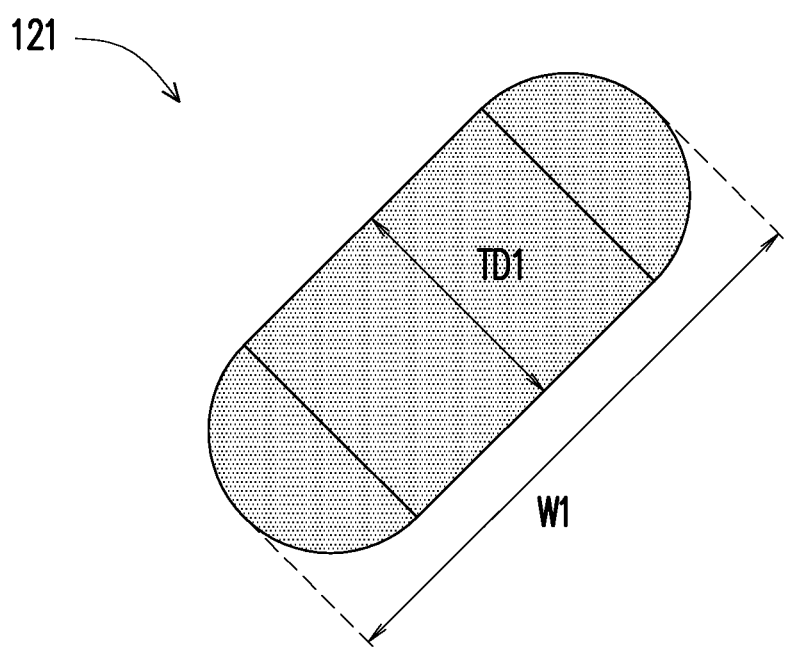

As illustrated in FIG. 6C, the first metal pad 121 has width W1 measured from a point on the first metal pad 121 most proximal to the innermost region 201 or centermost point 203 of second dielectric layer 117 to a point on first metal pad 121 most distal from the innermost region 201 or centermost point 203 of second dielectric layer 117. The first metal pad 121 has a first tangential diameter TD1 measured perpendicularly to the width W1. The first tangential diameter TD1 may be between about 0.1 µm and 10 µm, or between about 10 µm and 50 µm. The width W1 may be greater than or equal to the first tangential diameter TD1.

Figure 6D:
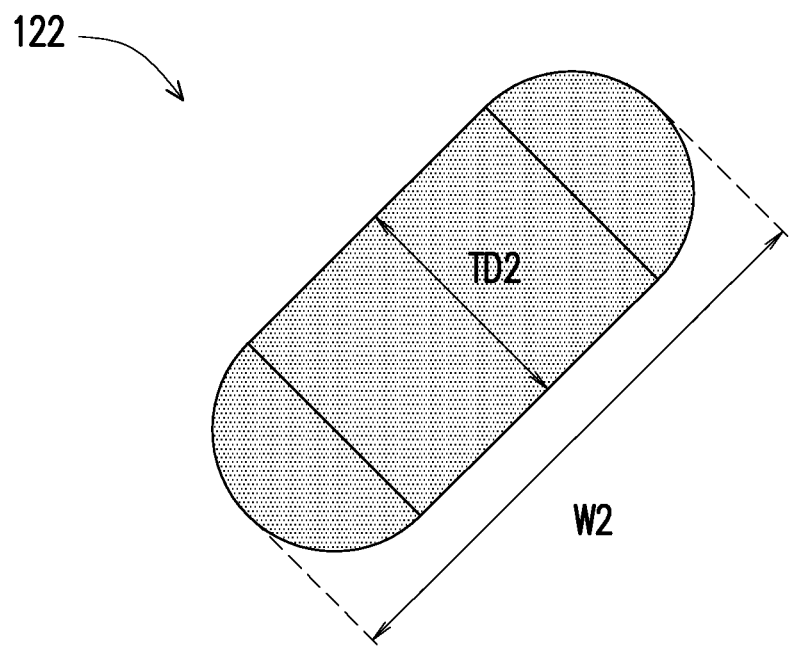

As illustrated in FIG. 6D, the second metal pad 122 has width W2 measured from a point on the second metal pad 122 most proximal to the innermost region 201 or centermost point 203 of second dielectric layer 117 to a point on the second metal pad 122 most distal from the innermost region 201 or centermost point 203 of second dielectric layer 117. The second metal pad 122 has a second tangential diameter TD2 measured perpendicularly to the width W2. The width W2 may be greater than or equal to the width W1. The second tangential diameter TD2 may be between about 0.1 µm and 10 µm, or between about 10 µm and 50 µm. The width W2 may be greater than or equal to the second tangential diameter TD2.

Figure 6E:
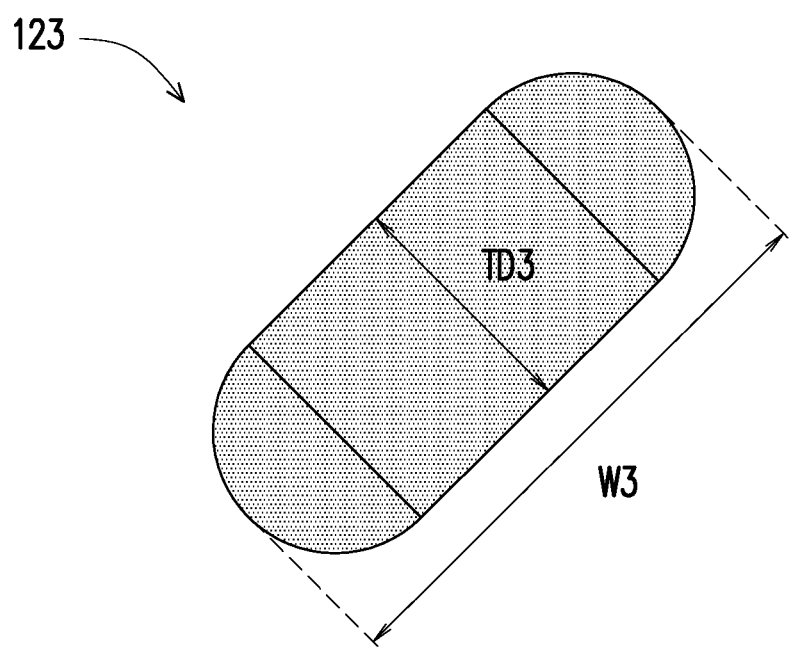

As illustrated in FIG. 6E, the third metal pad 123 has width W3 measured from a point on the third metal pad 123 most proximal to the innermost region 201 or centermost point 203 of second dielectric layer 117 to a point on the third metal pad 123 most distal from the innermost region 201 or centermost point 203 of second dielectric layer 117. The third metal pad 123 has a third tangential diameter TD3 measured perpendicularly to the width W3. The width W3 may be greater than or equal to the width W2 and/or width W1. The third tangential diameter TD3 may be between about 0.1 µm and 10 µm, or between about 10 µm and 50 µm. The width W3 may be greater than or equal to the third tangential diameter TD3.

Figure 7A:
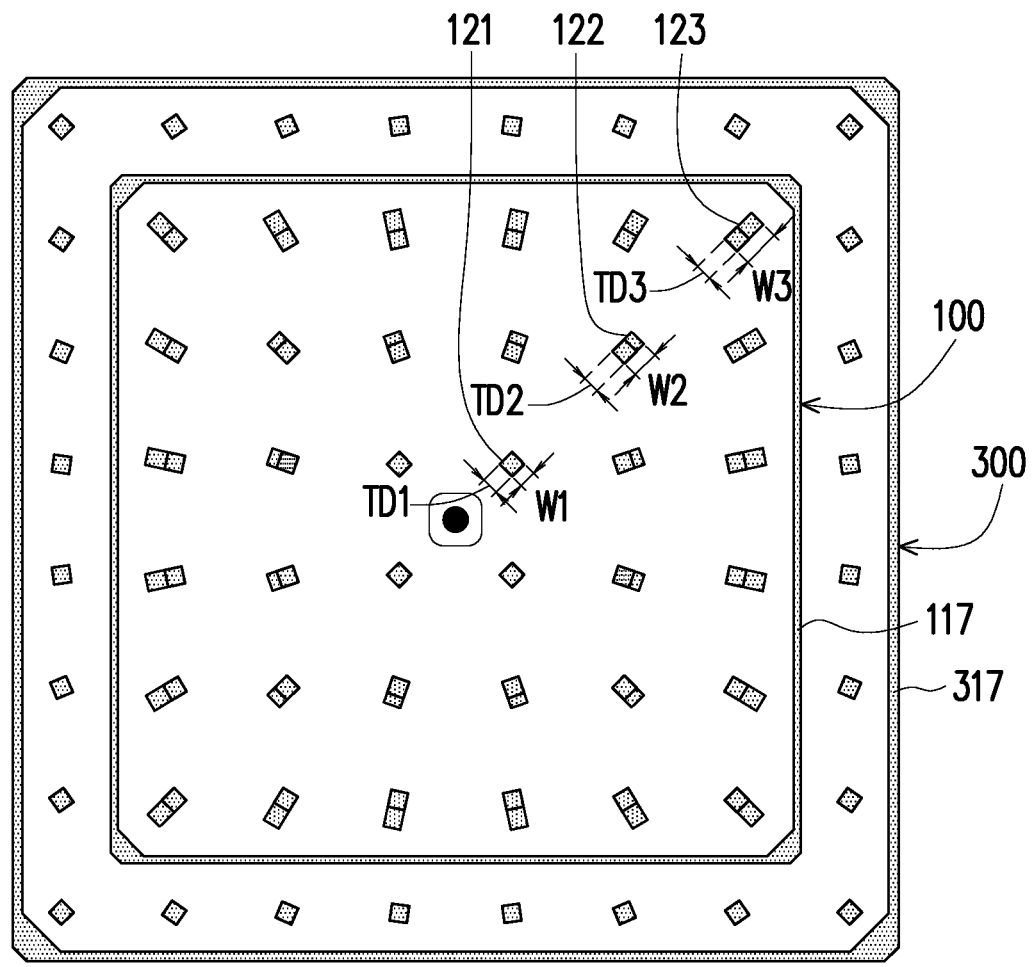
FIG. 7A illustrates a top down view of the first semiconductor device bonded to the second semiconductor device, in accordance with some embodiments.
Figure 7B:
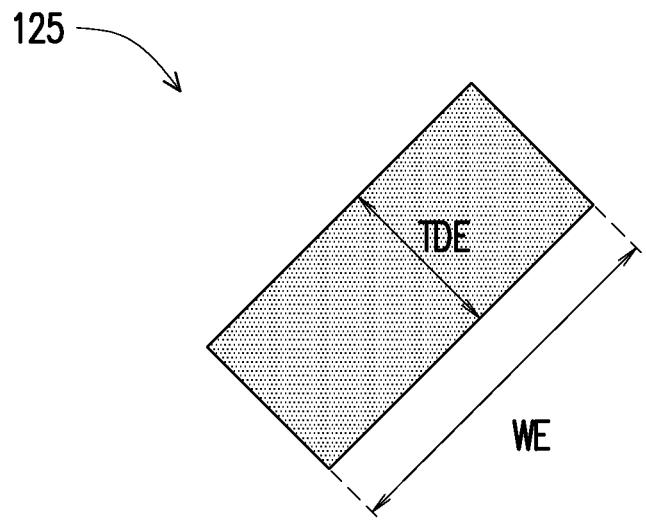
FIGS. 7B-7E illustrate top down views of a metal pad on the first semiconductor device, in accordance with some embodiments.

As illustrated in FIG. 7A, some or all of the first metal pad 121, the second metal pad 122, the third metal pad 123, or the fourth metal pad 301 may have a square or rectangular shape. Some or all of those rectangular metal pads may be oriented such that the longest diameter from side to side points toward the innermost region 201 and/or the centermost point 203. As illustrated in FIG. 7B, the first exemplary metal pad 125 may be formed as shown. In this embodiment, the width WE of the first exemplary metal pad 125 may be selected to account for the expected expansion of the first semiconductor device 100 at about the location of the first exemplary metal pad 125. In particular, a point on the first semiconductor device 100 that corresponds to a center of the second exemplary metal pad 325, before expansion of the first semiconductor device 100, will move away from the centermost point 203 by about the product of the expansion coefficient EC and the distance d2 of the second exemplary metal pad 325, after expansion of the first semiconductor device 100. As such, the width WE of the first exemplary metal pad 125 may be chosen to account for that expansion and, accordingly, be calculated by the following equation:

$$WE = W4 + (EC*d2)$$

The calculated width WE of the first exemplary metal pad 125 will, therefore, include that movement caused by the expansion. That is, the width WE of the first exemplary metal pad 125 may be calculated as greater than the width W4 of the second exemplary metal pad 325 by the amount of expected expansion around the location of the first exemplary metal pad 125. This equation may be applied to each metal pad, individually, on the first semiconductor device 100. In another embodiment, the equation may be applied to one representative metal pad in the set of the first metal pad 121, to one representative metal pad in the set of the second metal pad 122, and/or one representative metal pad in the set of the third metal pad 123. For any given set, the representative metal pad may be the closest metal pad in that set to the centermost point 203, the farthest metal pad in that set from the centermost point 203, or otherwise. In another embodiment, the equation may be applied to one representative metal pad in multiple sets of metal pads. Any combination of the variations of applying the equation to individual metal pads and representative metal pads may be used to choose the widths of the metal pads in the first semiconductor device 100.

The location of the first exemplary metal pad 125 may be calculated. The location of the first exemplary metal pad 125 may be chosen so that its point that is closest to the innermost region 201 on the first semiconductor device 100 and/or centermost point 203 will align with the point on the corresponding second exemplary metal pad 325 that is closest to the central point 303 on the second semiconductor device 300. As such, the location of the center of first exemplary metal pad 125 at a distance d1 from the centermost point 203 may be calculated by the following equation:

$$d1 = d2 + \left(\frac{EC*d2}{2}\right)$$

Alternatively, the distance d1 may be calculated based on the width WE of the first exemplary metal pad 125 and the width W4 of the corresponding second exemplary metal pad 325 by the following equation:

$$d1 = d2 + \frac{WE - W4}{2}$$

Figure 7C:
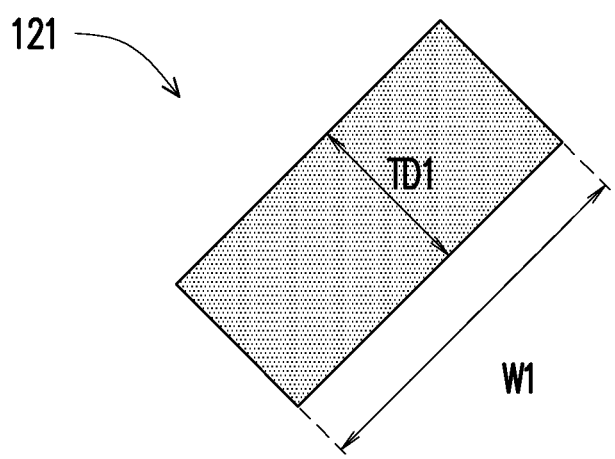

As illustrated in FIG. 7C, the first metal pad 121 has width W1 measured from a point or side on the first metal pad 121 most proximal to the innermost region 201 or the centermost point 203 of second dielectric layer 117 to a point or side on first metal pad 121 most distal from the innermost region 201 or centermost point 203 of second dielectric layer 117. The first metal pad 121 has a first tangential diameter TD1 measured perpendicularly to the width W1. The first tangential diameter TD1 may be between about 0.2 µm and 5 µm, or between about 5 µm and 20 µm. The width W1 may be greater than or equal to the first tangential diameter TD1.

Figure 7D:
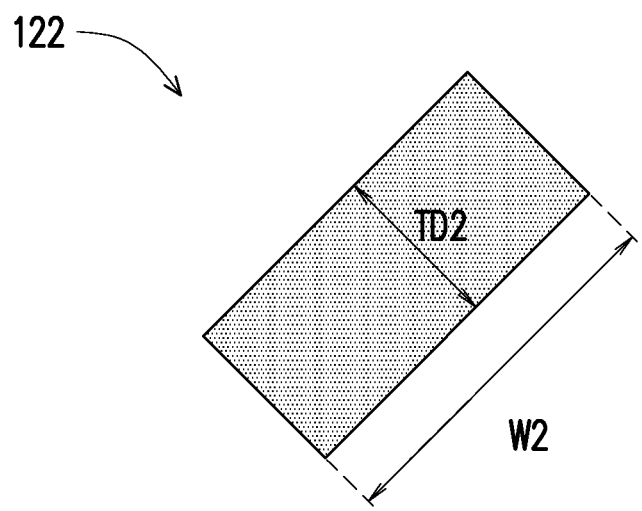

As illustrated in FIG. 7D, the second metal pad 122 has width W2 measured from a point or side on the second metal pad 122 most proximal to the innermost region 201 or the centermost point 203 of second dielectric layer 117 to a point or side on the second metal pad 122 most distal from the innermost region 201 or centermost point 203 of second dielectric layer 117. The second metal pad 122 has a second tangential diameter TD2 measured perpendicularly to the width W2. The width W2 may be greater than or equal to the width W1. The second tangential diameter TD2 may be between about 0.2 µm and 5 µm, or between about 5 µm and 20 µm. The width W2 may be greater than or equal to the second tangential diameter TD2.

Figure 7E:
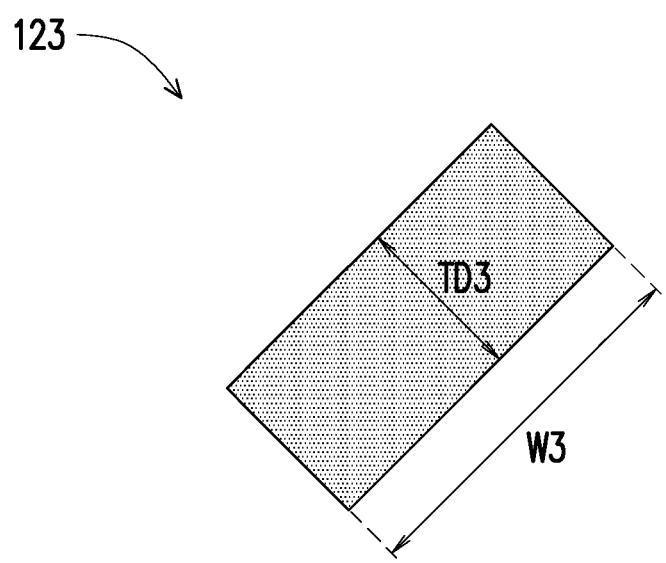

As illustrated in FIG. 7E, the third metal pad 123 has width W3 measured from a point or side on the third metal pad 123 most proximal to the innermost region 201 or the centermost point 203 of second dielectric layer 117 to a point or side on the third metal pad 123 most distal from the innermost region 201 or centermost point 203 of second dielectric layer 117. The third metal pad 123 has a third tangential diameter TD3 measured perpendicularly to the width W3. The width W3 may be greater than or equal to the width W2 and/or the width W1. The third tangential diameter TD3 may be between about 0.2 µm and 5 µm, or between about 5 µm and 30 µm. The width W3 may be greater than or equal to the third tangential diameter TD3.

In another embodiment, some or all of the first metal pad 121, the second metal pad 122, and the third metal pad 123 may align differently than discussed above. For example, the point or side on first exemplary metal pad 125 that is farthest from the innermost region 201 and/or the centermost point 203 of the first semiconductor device may align with the point or side on the second exemplary metal pad 325 that is farthest from the central point 303 on the second semiconductor device. As such, the width WE of the first exemplary metal pad 125 may be calculated as above, however, the distance d1 of the first exemplary metal pad 125 from the centermost point 203 may be calculated by the following equation:

$$d1 = d2 - \frac{WE}{2}$$

In another embodiment, some or all of the first metal pad 121, the second metal pad 122, and the third metal pad 123 may align differently than discussed above. For example the center of the first exemplary metal pad 125 of the first semiconductor device 100 may align with the center of the second exemplary metal pad 325 of the second semiconductor device 300. As such, the width WE of the first exemplary metal pad 125 may be calculated as above, however, the distance d1 of the first exemplary metal pad 125 from the centermost point 203 may be the same as distance d2 of the second exemplary metal pad 325 from the central point 303.

As discussed above, the metal pads of the first semiconductor device 100 (e.g., the first metal pads 121, the second metal pads 122, the third metal pads 123, etc., including the first exemplary metal pad 125) are formed in the second dielectric layer 117. The first exemplary metal pad 125 is formed before the expansion discussed above takes effect. As such, the first exemplary metal pad 125 may not be formed at distance d1 from the centermost point 203 and, instead, may be formed at a distance d3 from the centermost point, which may be shorter than distance d1. In an embodiment, the distance d3 will be equal to the distance d2. However, in another embodiment, the distance d3 may be less than the distance d2. And in another embodiment, the distance d3 may be greater than the distance d2.

As illustrated in FIGS. 8A-8D, the first semiconductor device 100 and the second semiconductor device 300 are aligned before and/or during the bonding step with the use of alignment marks. However, the expansion may also cause additional overlay issues when aligning the first semiconductor device 100 with the second semiconductor device 300. For example, depending on whether one or both of the first semiconductor device 100 and the second semiconductor device 300 have undergone an expansion as described above, the alignment marks for the devices may not align perfectly with one another. Alignment errors may cause high resistance or open circuits at the bonding interface between the first semiconductor device 100 and the second semiconductor device 300.

Figure 8A:
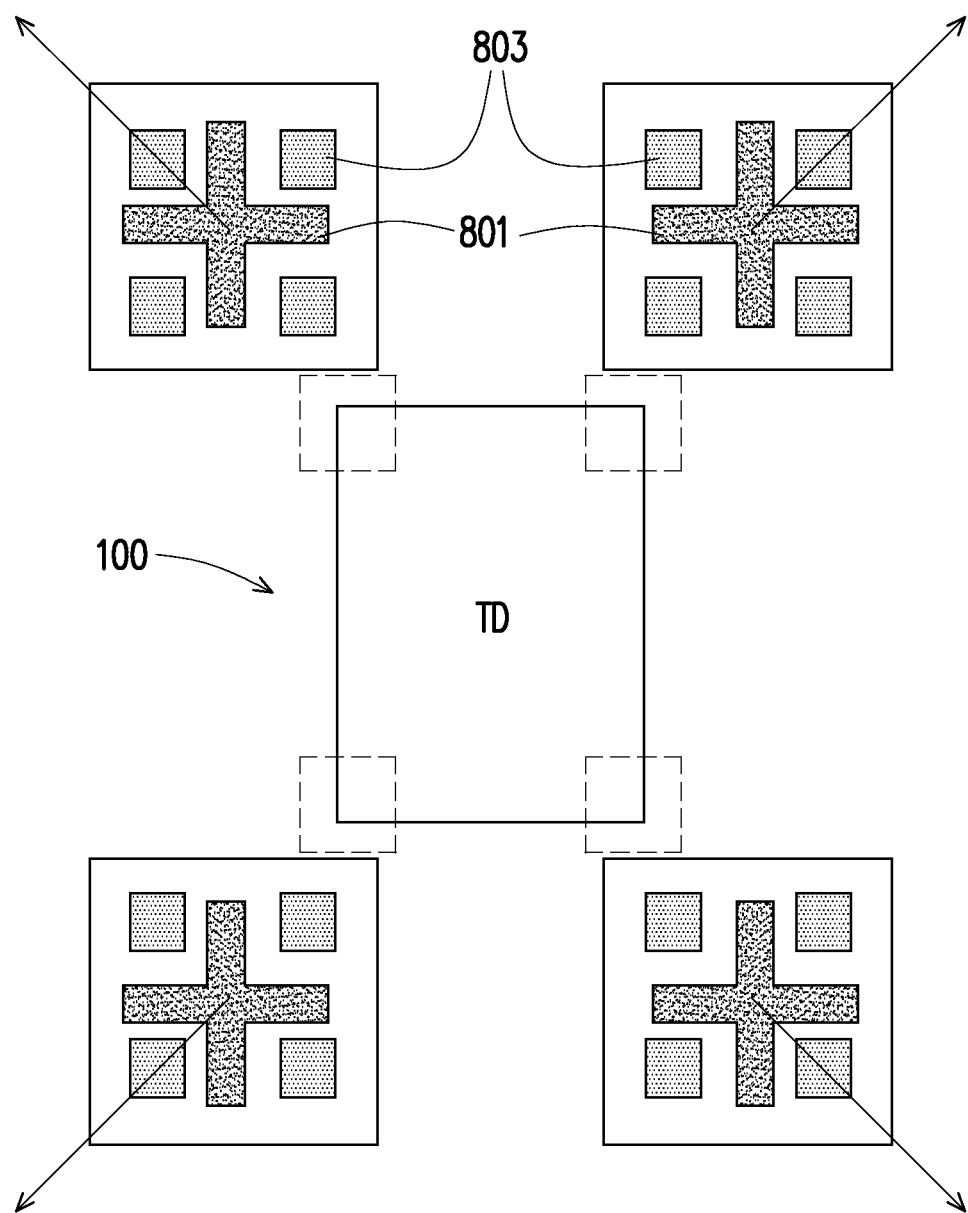
FIGS. 8A-8D illustrate schematics of alignment marks on each of the first and second semiconductor devices.
Figure 8B:
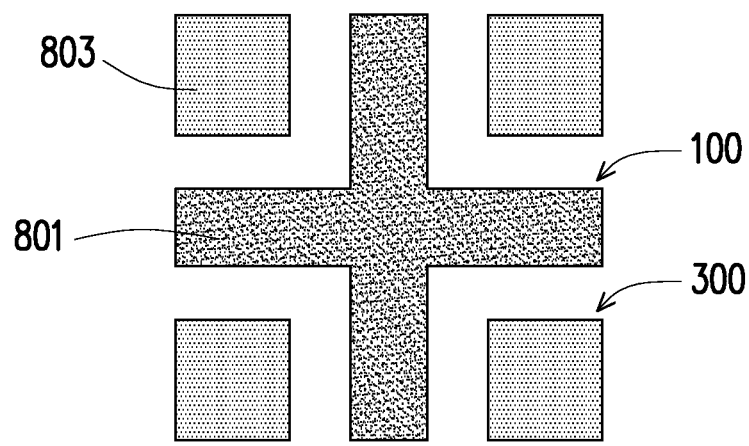
Figure 8C:
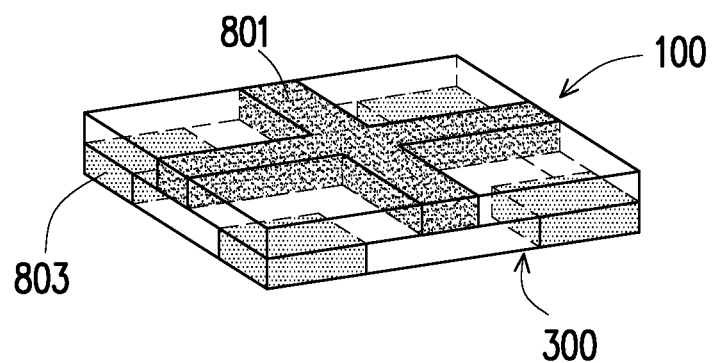
Figure 8D:
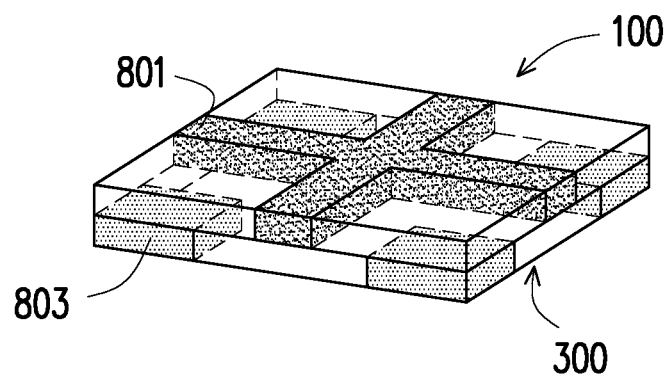

FIG. 8A illustrates how first alignment marks 801 on the first semiconductor device 100 may move outward relative to second alignment marks 803 on the second semiconductor device 300. FIGS. 8B-8D are schematic representations from a variety of perspectives to show how those alignment marks are intended to align in an ideal (i.e., non-expansion) case.

Figure 9B:
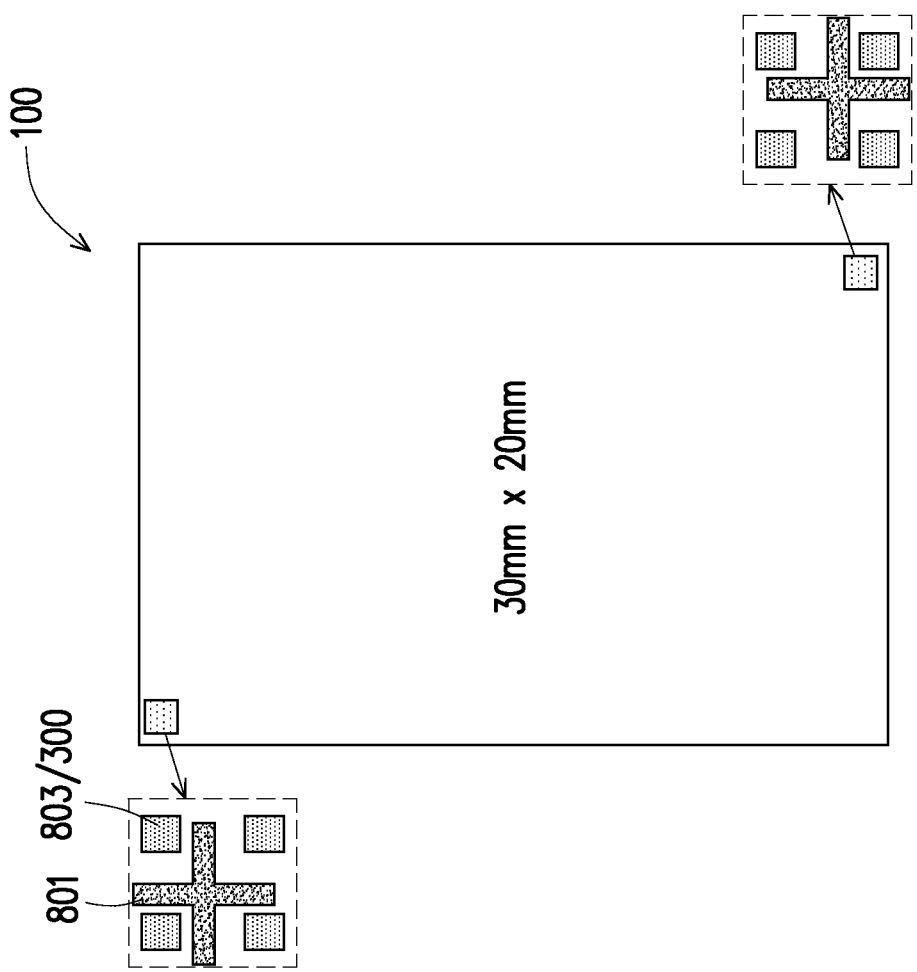
FIGS. 9A-9B illustrate schematics of alignment marks on each of the first and second semiconductor devices wherein the first semiconductor device has varying different dimensions.
Figure 9A:
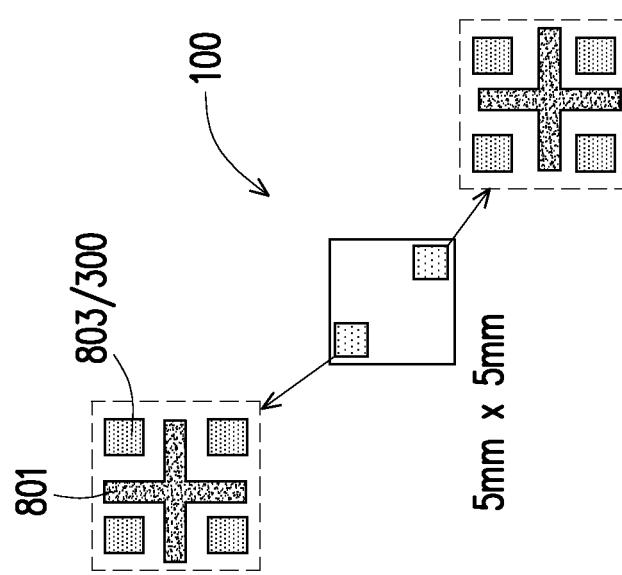

FIGS. 9A-9B illustrate schematic representations of the degrees to which the alignment marks on each device may move relative to one another. FIG. 9A illustrates the first semiconductor device being a 5 mm×5 mm die. FIG. 9B illustrates the first semiconductor device being a 30 mm×20 mm die. The first alignment marks 801 may move relative to the second alignment marks 803 on the second semiconductor device 300 (labeled collectively in FIGS. 9A and 9B) due to shifting, rotation, and/or expansion of the first semiconductor device 100 as described above. In particular, the first alignment marks 801 may move relative to the second alignment marks 803 to a greater degree when the first semiconductor device 100 has greater dimensions, such as 30 mm×20 mm, as compared to when the first semiconductor device 100 has smaller dimensions, such as 5 mm×5 mm.

The alignment of the first alignment marks 801 with the second alignment marks 803 depends on overlay errors caused by the alignment tool and the above-described expansion. The alignment tool may contribute to an alignment overlay (OVL) error OVL due to a shift error $OVL_{shift}$ and/or a rotation error $OVL_{rotation}$ of the first semiconductor device 100 with respect to the second semiconductor device 300. The rotation error $OVL_{rotation}$ may be further related to the dimensions of the first semiconductor device 100 and/or the second semiconductor device 300 and, therefore, tends to be greater with increasing sizes of the smaller die, such as the first semiconductor device 100. In addition, an expansion error $OVL_{expansion}$, caused by the expansion as described above, also contributes to the alignment error OVL. As such, a total potential alignment overlay error OVL may be expected based on the following equation:

$$OVL = OVL_{shift} + OVL_{rotation} + OVL_{expansion}$$

In regard to the 5 mm×5 mm die, the expected expansion error $OVL_{expansion}$ may be about 0.2 μm. Combined with the shift error $OVL_{shift}$ and the rotation error $OVL_{expansion}$ of the alignment tool for that sized die, the total potential alignment overlay error OVL may be about 0.9 μm. In regard to the 30 mm×20 mm die, the expected expansion error $OVL_{expansion}$ may be about 0.9 μm. Combined with the shift error $OVL_{shift}$ and the rotation error $OVL_{expansion}$ of the alignment tool for that sized die, the total potential alignment overlay error OVL may be about 1.9 μm. It should be noted, therefore, that in both cases the expansion effect generally does not cause misalignment beyond the tolerances of the metal pads (e.g., the first metal pads 121, the second metal pads 122, the third metal pads 123, etc.) of the first semiconductor device 100 when the metal pads each have widths greater than or equal to about 2.5 μm.

Embodiments may have advantages. For example, increases in the width of the metal pads of a thinned die and modifications to their distances from the centermost point on the thinned die accounts for the expansion of the die that often results from warpage caused by processes performed on the wafer or singulated die, such as die or wafer thinning. In other words, the increases in the width of the metal pads of the thinned die and modifications to their distances from the centermost point on the thinned die help to improve the alignment of the metal pads on the thinned die with the corresponding metal pads on the semiconductor device to which the thinned die will be bonded. Improved alignment ensures that metal can be bonded to metal and dielectric material to dielectric material during the hybrid bonding process. The improved alignment and bonding help to increase the performance of the resulting device by improving the strength of the bond and the electrical connections between the thinned die and the other device.

According to an embodiment, a semiconductor device includes a first die and a second die. The first die includes a first passivation layer over a first substrate, and first bond pads in the first passivation layer. The second die includes a second passivation layer, which is bonded to the first passivation layer, and second bond pads in the second passivation layer, which are bonded to the first bond pads. The second bond pads include inner bond pads and outer bond pads, which have a greater diameter than the inner bond pads.

According to another embodiment, a semiconductor device includes a first dielectric layer, first metal pads in the first dielectric layer, a second dielectric layer over the first dielectric layer, and second metal pads in the second dielectric layer over the first metal pads. Each of the first metal pads has a first diameter D1, and the first metal pads and the first dielectric layer having coplanar top surfaces. The second dielectric layer is bonded to the first dielectric layer, and the second metal pads are bonded to the first metal pads. The second metal pads include an inner set and an outer set. The inner set has a first maximum diameter. The outer set, which forms a concentric ring around the inner set, has a second maximum diameter that is greater than the first diameter and the first maximum diameter.

According to a further embodiment, A method of forming a semiconductor device includes forming a first die, which includes, forming a first interconnect structure over a front side of a first substrate, forming a first dielectric layer over the first interconnect structure, patterning the first dielectric layer to form first trenches in the first dielectric layer, and forming first metal pads in the first trenches. The first metal pads include inner metal pads and outer metal pads, such that the inner metal pads have a first diameter, and the outer metal pads have a greater diameter than the first diameter. The method of forming the first die further includes planarizing the first dielectric layer and the first metal pads. The method of forming the semiconductor device further includes providing a second die, which includes a second dielectric layer over a second substrate, and second metal pads in the second dielectric layer. The second metal pads have a second diameter, and the second diameter is less than or equal to the first diameter. The method of forming the semiconductor device further includes activating upper surfaces of the first dielectric layer and upper surfaces of the first metal pads, activating upper surfaces of the second dielectric layer and upper surfaces of the second metal pads, and bonding the first die to the second die, such that the first dielectric layer is bonded to the second dielectric layer, and the first metal pads are bonded to the second metal pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first die, comprising:
a first passivation layer disposed over a first substrate; and
first bond pads disposed in the first passivation layer; and
a second die, comprising:
a second passivation layer, the second passivation layer being bonded to the first passivation layer; and
second bond pads disposed in the second passivation layer, each of the second bond pads being bonded to one of the first bond pads, the second bond pads comprising inner bond pads and outer bond pads, the outer bond pads having a greater diameter than the inner bond pads.

2. The semiconductor device of claim 1 further comprising third bond pads disposed in the second passivation layer, wherein the third bond pads are closer than the outer bond pads to an outer edge of the second passivation layer, and wherein the third bond pads have a greater diameter than the outer bond pads.

3. The semiconductor device of claim 1, wherein:
a center of one of the first bond pads is located a first distance from a center of the first passivation layer, the one of the first bond pads having a first diameter;
a center of one of the second bond pads is located a second distance from a center of the second passivation layer, the one of the second bond pads being bonded to the one of the first bond pads, the one of the second bond pads having a second diameter; and
the second distance being greater than the first distance.

4. The semiconductor device of claim 3, wherein the second diameter is greater than the first diameter.

5. The semiconductor device of claim 1, wherein a first edge of one of the first bond pads is aligned with a second edge of one of the second bond pads.

6. The semiconductor device of claim 5, wherein the first edge is most proximal to a central region of the first passivation layer, and wherein the second edge is most proximal laterally to the central region of the first passivation layer.

7. The semiconductor device of claim 1, wherein an entirety of a first surface of each of the first bond pads contacts a second surface of a corresponding one of the second bond pads.

8. A semiconductor device, comprising:
a first dielectric layer;
first metal pads disposed in the first dielectric layer, each of the first metal pads having a first diameter D1, the first metal pads and the first dielectric layer having coplanar top surfaces;
a second dielectric layer disposed over and bonded to the first dielectric layer; and
second metal pads disposed over and bonded to the first metal pads, the second metal pads comprising:
an inner set, the inner set having a first maximum diameter; and
an outer set, the outer set forming a concentric ring around the inner set, the outer set having a second maximum diameter, the second maximum diameter being greater than the first diameter and the first maximum diameter.

9. The semiconductor device of claim 8, further comprising:
a centermost point on the second dielectric layer;
a central point on the first dielectric layer disposed directly over the centermost point;
a first distance d1 measured from the central point to one of the first metal pads;
a second distance d2 measured from the centermost point to one of the second metal pads, the one of the second metal pads disposed directly over the one of the first metal pads;
an expansion coefficient EC of the second dielectric layer;
a second diameter D2 of the one of the second metal pads; and
wherein the second diameter D2 follows a first equation: $D2 \geq D1+(EC*d1)$.

10. The semiconductor device of claim 9, wherein the second distance d2 follows a second equation:

$$d2 \geq d1 + \frac{EC*d1}{2}.$$

11. The semiconductor device of claim 9, wherein the second distance d2 follows a third equation:

$$d2 \leq d1 - \frac{EC*d1}{2}.$$

12. The semiconductor device of claim 9, wherein the second distance d2 is about equal to the first distance d1.

13. The semiconductor device of claim 8, wherein the first maximum diameter is greater than the first diameter.

14. The semiconductor device of claim 8, further comprising:
a first die comprising the first dielectric layer and the first metal pads; and
a second die comprising the second dielectric layer and the second metal pads.

15. A semiconductor device, comprising:
a first die comprising:
a first dielectric layer disposed over a substrate;
a first plurality of metal pads disposed in the first dielectric layer, each of the first plurality of metal pads comprising a first diameter; and
a second plurality of metal pads disposed in the first dielectric layer, each of the second plurality of metal pads comprising a second diameter, the second diameter greater than the first diameter; and
a second die disposed over the first die, the second die comprising:
a second dielectric layer disposed over the first dielectric layer; and
a third plurality of metal pads disposed in the second dielectric layer, each of the third plurality of metal pads comprising a third diameter, the third diameter being less than the second diameter.

16. The semiconductor device of claim 15, wherein the second plurality of metal pads form a discontinuous ring around the first plurality of metal pads.

17. The semiconductor device of claim 16, wherein a first sidewall of a first one of the first plurality of metal pads is aligned with a first sidewall of a first one of the third plurality of metal pads.

18. The semiconductor device of claim 17, wherein a second sidewall of the first one of the first plurality of metal pads is misaligned with all sidewalls of the first one of the third plurality of metal pads.

19. The semiconductor device of claim 17, wherein a first sidewall of a first one of the second plurality of metal pads is aligned with a first sidewall of a second one of the third plurality of metal pads.

20. The semiconductor device of claim 19, wherein a second sidewall of the first one of the second plurality of metal pads is misaligned with all sidewalls of the second one of the third plurality of metal pads.

* * * * *